United States Patent [19]

Kirch et al.

[11] Patent Number: 5,149,974
[45] Date of Patent: Sep. 22, 1992

[54] GAS DELIVERY FOR ION BEAM DEPOSITION AND ETCHING

[75] Inventors: Steven J. Kirch, Lagrangeville, N.Y.; James P. Levin, Jericho, Vt.; Alfred Wagner, Brewster, N.Y.

[73] Assignee: International Business Machines Corporation, Armonk, N.Y.

[21] Appl. No.: 605,601

[22] Filed: Oct. 29, 1990

[51] Int. Cl.[5] .......................................... H01J 37/317
[52] U.S. Cl. .................................. 250/492.2; 250/309
[58] Field of Search ............ 250/492.21, 492.1, 492.3, 250/398, 397, 309; 427/38

[56] References Cited

U.S. PATENT DOCUMENTS

| | | | |
|---|---|---|---|
| 3,534,385 | 10/1970 | Castaing et al. | 250/309 |
| 3,845,305 | 10/1974 | Liebl | 250/309 |
| 4,108,751 | 8/1978 | King | 204/192 N |
| 4,119,881 | 10/1978 | Calderon | 313/360 |
| 4,585,945 | 4/1986 | Bruel et al. | 250/492.2 |
| 4,587,425 | 5/1986 | Plows | 250/397 |
| 4,609,809 | 9/1986 | Yamaguchi et al. | 250/492.21 |
| 4,698,236 | 10/1987 | Kellogg et al. | 427/43.1 |
| 4,868,086 | 9/1989 | Yamaguchi et al. | 427/38 |
| 4,902,530 | 2/1990 | Yasoka et al. | 427/38 |
| 4,983,830 | 1/1991 | Iwasaki | 250/309 |

Primary Examiner—Bruce C. Anderson
Attorney, Agent, or Firm—John J. Goodwin

[57] ABSTRACT

An ion beam structure includes a gas container, such as a cylindrical can having first and second apertures through the center of the top and bottom walls respectively of the container such that a narrow ion beam is passed through the apertures and the center axis of the can and onto a target specimen such as a mask or chip or other article of manufacture disposed closely below the bottom of the can. The can may further include deflection means for applying voltages and/or magnetic fields to locations on the can (i.e., top, bottom, sides) to direct secondary charged particles such as electrons emitted from the specimen onto an electron detection means such that the structure functions as an imaging system. The electric and/or magnetic fields may be employed to increase the collection efficiency of the detector and thereby improve the quality of the image by increasing the signal to noise ratio. When the collected image produced by the secondary charged particles indicates that a repair or other modification be performed, a gas is introduced into the can from a gas reservoir via a tube. The gas, which contains first type particles (i.e. gold atom, tungsten atom, etc.) leaves the can via the bottom aperture and is adsorbed onto the nearby target specimen surface. The ion beam, containing second type particles (i.e. gallium ions) passes through the gas with minimum interaction and strikes the target specimen surface to decompose the adsorbed gas and the decomposed first type particles to provide the modification such as repair to the specimen (mask or chip) surface.

11 Claims, 1 Drawing Sheet

GAS DELIVERY FOR ION BEAM DEPOSITION AND ETCHING

FIELD OF THE INVENTION

The subject invention relates to ion beam deposition and etching systems, and more particularly to a system wherein an ion beam is directed onto a target surface to modify the target.

Description of the Prior Art

U.S. Pat. No. 4,585,945, issued Apr. 29, 1986 to Bruel et al, entitled PROCESS AND APPARATUS FOR IMPLANTING PARTICLES IN A SOLID, describes a structure wherein a gas containing first type particles is enclosed in a cylindrical confinement means having a primary opening on one side through which a high energy beam of second type particles is directed. The high energy beam of second type particles interact with the first type particles of the gas in the can and the first type particles pass through a secondary opening in the other side of the cylindrical confinement means to reach and deposit onto the target.

The prior art patent also discloses that the cylindrical confinement means may be surrounded by cooling coils to condense the gas and may include other functional additions such as collimators and heaters.

In the present invention there is substantially no interaction between the ion beam and the atoms of the gas in the can. The ion beam is focussed to a very narrow diameter and the gas pressure is minimal to avoid interaction. The gas is adsorbed onto the surface of the target beneath the can, and the ion beam then interacts with the adsorbed gas particles to decompose the adsorbed gas and deposit the metal atoms on the target surface.

U.S. Pat. No. 4,119,881, issued Oct. 10, 1978 to Calderon entitled ION BEAM GENERATOR HAVING CONCENTRICALLY ARRANGED FRUSTO-CONICAL ACCELERATING GRIDS, discloses a grid system for an ion beam generator having a frusto-conical shape so that the collimated ion beam converges at a predetermined angle toward the target to provide selective beveled etching.

In U.S. Pat. No. 4,108,751, issued Aug. 22, 1978 to King, entitled ION BEAM IMPLANTATION-SPUTTERING, material is deposited onto and implanted into a substrate by directing a beam of ions against a target, comprised of the material to be deposited, so as to sputter neutral particles and ionized particles from the target towards the substrate. The ionized particles are accelerated to energies sufficient to penetrate the substrate and be implanted therein and provide a strong bond. Sputter cleaning of the substrate surface by particles of sufficient energy also takes place.

SUMMARY OF THE INVENTION

An object of the present invention is to provide an improved gas delivery system for ion beam deposition, etching and other target modification.

Another object of the present invention is to provide an improved ion beam deposition system capable of imaging a target surface and modifying the target surface.

A further object of the present invention is to provide an improved ion beam deposition system which functions to both detect defects on a target mask or chip and to repair the detected defects.

Still another object of the present invention is to provide an improved ion beam system wherein the ion beam functions to release secondary electrons or ions from a target surface which are collected to form an image of the target surface.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
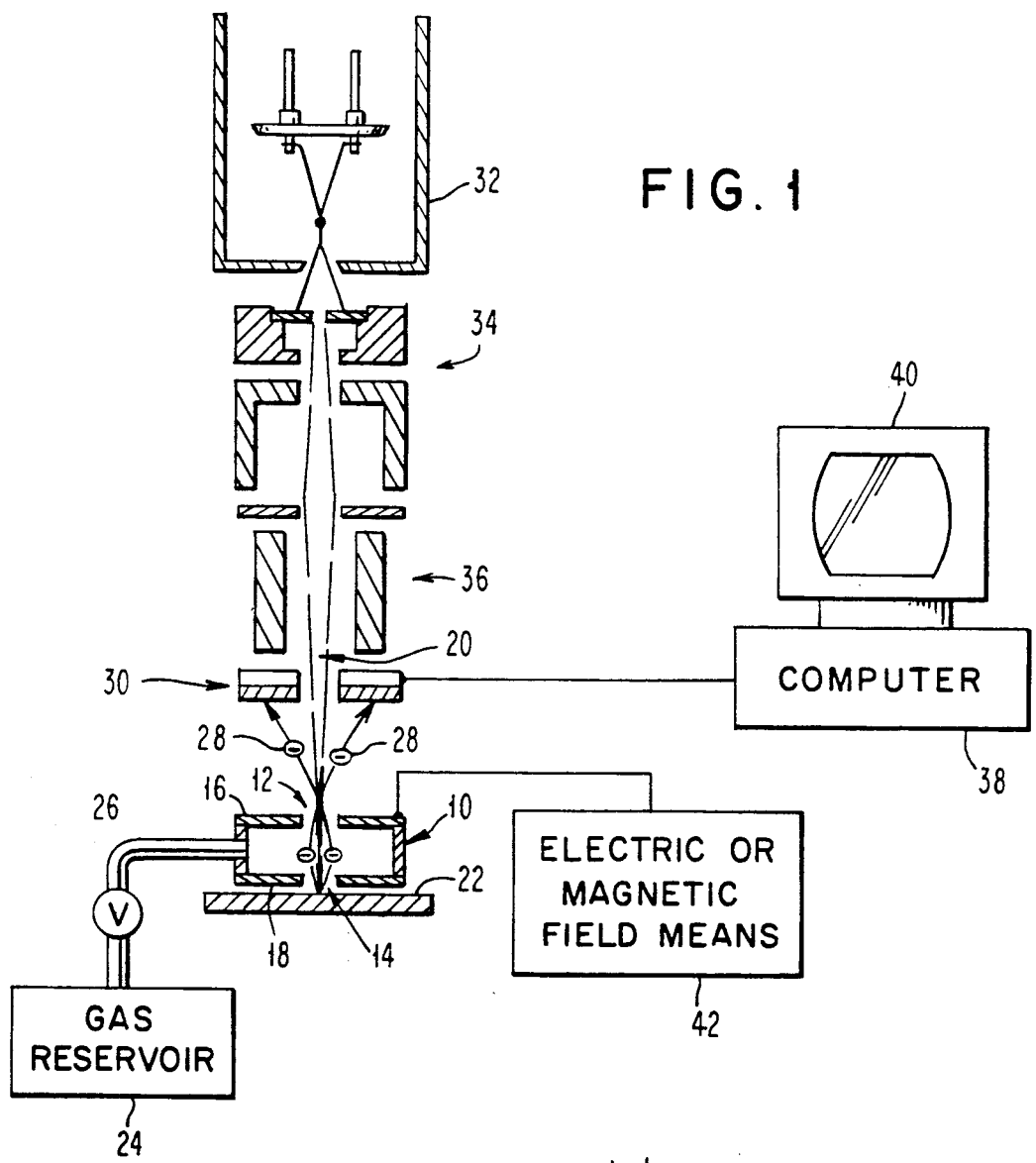
FIG. 1 is a schematic illustration of a side elevation view of an improved gas delivery system according to the principles of the present invention.

Referring to FIG. 1, a schematic side elevation view is provided of an embodiment of the present invention which functions to both image a target surface and to modify the target surface. More particularly, the structure of FIG. 1 can function to image and detect defects on a target mask or chip surface, and repair such defects after detection.

In the detection function, an ion beam is directed onto a target surface of an article such as a mask or chip to release secondary charged particles, i.e., ions or electrons. The secondary charged particles are collected and form an image of the target surface to determine, for example, if repairs or other type modifications are necessary. The image is created in a manner analogous to a scanning electron microscope. The ion beam is scanned in a raster over the sample while synchronously scanning the electron beam in a conventional cathode ray tube. The image is formed by modulating the intensity of the CRT beam based on the amplitude of the signal generated by the detector.

In the deposition mode, the same ion beam interacts with organometallic particles (i.e., atoms) adsorbed by the target specimen surface from a gas to decompose the particles to repair the target specimen surface.

In FIG. 1, the embodiment of the structure includes a gas container 10, such as a cylindrical can having apertures 12 and 14 through the center of the top 16 and bottom 18 ends such that a narrow ion beam 20 is passed through the apertures 12 and 14 and center axis of the can and onto a target 22 (i.e., mask or chip) disposed closely below the bottom 18 of the can. The can may further include means 42 for applying voltages and/or magnetic fields to points on the can (i.e., top, bottom, sides) to direct secondary charged particles, i.e., ions or electrons, emitted from target 22 onto detection means 30 such that the structure functions as an imaging system. The electric and/or magnetic fields are employed to increase the collection efficiency of the detector and thereby improve the quality of the image by increasing the signal to noise ratio. One skilled in the art will appreciate that detection means available in the art include means for providing magnetic or electric fields so the means 42 may not be necessary in the embodiment of FIG. 1.

The ion beam 20 is generated in a conventional manner by an ion beam column including an ion source 32 such as a liquid metal ion source known in the art. The ion beam 20 is shaped and deflected in a conventional manner by state-of-the-art lens means 34 and deflection means 36.

The ion beam 20 is directed through apertures 12 and 14 and strikes the target 22 and releases secondary charged particles 28 which are attracted and transmitted through the container 10 to a detector means 30 provide an image of the target surface. One skilled in the art will appreciate that the invention can operate in some applications with secondary ions, however, secondary electrons will be used in the following description. Detector means 30, which may be a photoelectric sensing means, provides an electric signal corresponding to the image or pattern of the secondary target electrons to a digital computer means 38 which provides a raster function and creates a display of that target surface on display means 40.

When the collected image on display means 40 indicates that a modification such as a repair is necessary, a gas is introduced into the can from gas reservoir 24 via tube 26. The gas, which contains first type particles (i.e. gold atoms, tungsten atoms, etc.) leaves the can 10 via the bottom aperture 14 and is adsorbed onto the nearby target surface 22. The ion beam 20, containing second type particles (i.e. gallium ions) passes through the gas with minimum interaction and strikes the target surface 22 to decompose the adsorbed gas and the decomposed first type particles (metallic atoms) provide the repair to the mask or chip surface 22.

Using the embodiment shown in FIG. 1, ion beam deposition of gold was performed using a 20 keV beam of gallium ions, approximately 0.25 microns in diameter with an ion current of 320 pA directed at the sample. An organometallic gas (dimethyl gold hexafluro acetyacetonate) was flowed through the gas delivery system. The gas pressure in the can 10 was approximately 8 millitorr. The gap between the bottom 18 of the gas can and the sample 22 was approximately 100 um. The ion beam deposited material, upon decomposition, was approximately 50 atomic percent gold, 50 atomic percent carbon. The deposition rate was approximately 2 cubic microns per second, corresponding to a yield of 50 atoms deposited per incident gallium ion. Images of the sample were obtained by detecting secondary electrons emitted from the sample when the ion beam was raster scanned over the surface of the sample.

The embodiment of the invention shown in FIG. 1 also performed ion beam deposition using gas delivery under other conditions. Organometallic gases such as tungsten carbonyl, dimethyl gold trifluro acetylacetonate, and trimethylamine alane, and organic gases such as styrene, bromostyrene, N-phenyl maleimide, and mercaptans have been used. Typical gas pressures in the can 10 ranged from 0.1 to 20 millitorr. Beam diameter of 0.5 microns to 30 microns have been employed, with beam energies of 5 to 100 keV and gallium ion currents of 10 pA to 10 nA. Although gallium is the most commonly used ion species in focused ion beam systems, any ion species can be used for deposition. For example, gold was deposited using a broad area beam (approximately 1 mm in diameter) of 2 to 10 keV helium, neon, argon and xenon ions.

Figure 2:
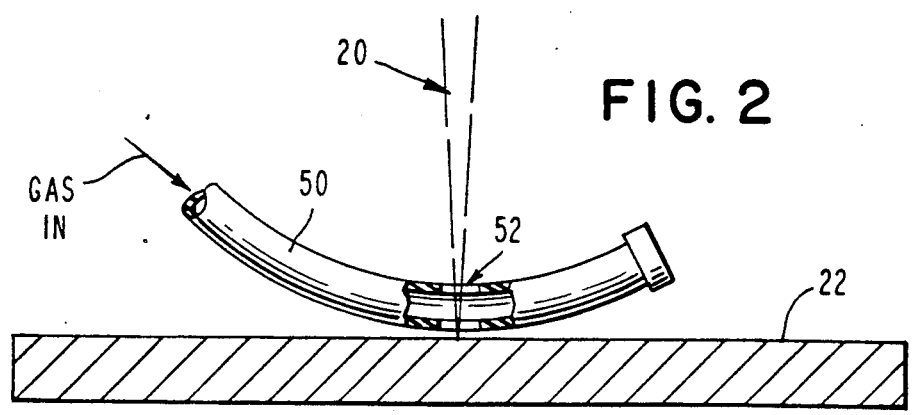
FIG. 2 is a schematic illustration of a side elevation view of an alternative embodiment of a gas delivery system according to the principles of the present invention.

FIG. 2 illustrates an alternative embodiment of the invention which provides a very simple way to implement the gas delivery system and incorporates a piece of cylindrical tubing 50 with a hole 52 through the center. It does not include the electric or magnetic field of FIG. 1 which makes it simpler to fabricate. It is also simpler to operate because it does not have to be well aligned parallel to the sample since the surface of the tube 50 next to the sample 22 is round rather than flat. The embodiment of FIG. 2 is able to provide adequate images of the sample to a detector 30 (not shown in FIG. 2) even though the tube 50 does not include the applied electric and magnetic fields. The reason that an image can be obtained without directing the secondary electrons within electric and magnetic fields is that the secondary electrons can pass around the outside of the tube 50, in addition to passing through the hole 52 in the tube, so the applied fields are not as important.

Although, the invention was described relative to the detection, by imaging, of defects in a target such as a mask or chip, and the repair of such defect, the invention is not limited to this application. The invention may also be usefully employed in the manufacture of an article, wherein the article is imaged and then modification of the surface of the article is performed. For example, the present invention may be used to etch an imaged target.

Having thus described our invention what we claim as new and desire to secure as Letters Patent, is:

1. An ion beam structure for specimen imaging and modification comprising:
   a gas container means disposed over a target specimen, said container means having an upper side with first aperture therein and a lower side with a second aperture therein co-linear with said first aperture,
   an ion beam generator for generating a focussed ion beam, said beam generator disposed over said gas container means wherein said ion beam passes through said first and second apertures onto said specimen,
   a gas supply means connected to said container for introducing into said gas container means a gas containing a species to be adsorbed onto said specimen surface, wherein said gas contains said species passes through said second aperture on said lower side of said container means and exits said container in order to be adsorbed onto said specimen surface and wherein said ion beam decomposes said adsorbed gas on said target specimen for deposition at very small local position.

2. An ion beam structure according to claim 1 wherein said species contained in said gas to be adsorbed onto said specimen surface is metallic atoms, wherein said gas with said metallic atoms passes through said second aperture on said lower side of said container means to be adsorbed onto said specimen surface,
   and wherein said focussed ion beam is directed onto said adsorbed gas and metallic atoms adsorbed onto said specimen surface to cause said metallic atoms and said gas to decompose and to cause said metallic atoms to deposit onto said specimen surface.

3. An ion beam structure according to claim 2 wherein said gas container is a cylindrical can having parallel upper and lower end sides.

4. An ion beam structure according to claim 2 wherein said gas container is an arced tube having said first and second apertures on upper and lower sides of said tube disposed over said specimen.

5. An ion beam structure according to claim 1 wherein said species contained in said gas to be adsorbed onto said specimen surface is a reactive species, wherein said gas with said reactive species passes through said second aperture on said lower side of said container means to be adsorbed onto said specimen surface, and wherein said focussed ion beam is directed onto said adsorbed gas and reactive species adsorbed onto said specimen surface to cause said specimen surface to be modified.

6. An ion beam structure according to claim 1 wherein said ion beam passes through said first and second apertures onto said specimen and releases secondary charged particles from said target specimen, said released secondary charged particles traveling from said target specimen through said second and first apertures, charged particle detection means disposed proximate to said first aperture in said upper side of said container means for detecting said charged particles traveling deflected through said first aperture for producing an electronic signal representative thereof, deflection means connected to said container means for creating a charged particle deflection field within said container means for deflecting said secondary charged particles away from said target specimen through said second and first apertures of said lower and upper container sides respectively, wherein said charged particle deflection means deflects said ion beam over the surface of said specimen in a raster pattern wherein said secondary charged particles released from said specimen correspond to a pattern of said target specimen surface, and radiation sensitive means responsive to said secondary charged particles deflected onto said detection means for producing an electronic signal corresponding to said pattern of said target specimen surface, said charged particle detection means further including display means connected to said radiation sensitive means for producing an image of said specimen surface derived from said electronic signal produced by said secondary charged particles to provide a display indication of said specimen surface including the presence of defects in said specimen surface.

7. An ion beam structure according to claim 6 wherein said focussed ion beam is deflected by said deflection means to the presence of said defects in said specimen surface to wherein said metallic atoms deposit onto said specimen surface at said defect location.

8. An ion beam structure according to claim 6 wherein the direction of said focussed ion beam is roughly perpendicular to the surface of the said target specimen.

9. An ion beam structure according to claim 6 wherein said charged particles are electrons.

10. A method for imaging and modifying the surface of a target specimen comprising the steps of:

Step 1: in an imaging mode directing a focussed ion beam through first and second apertures in an empty gas container and onto said target specimen for releasing secondary charged particles from said target specimen surface, Step 2: deflecting said secondary charged particles from said target specimen back through said second and first apertures of said gas container, wherein said ion beam is deflected over the surface of said target specimen in a raster pattern wherein said secondary charged particles released from said target specimen correspond to a pattern of said target specimen surface, Step 3. and detecting said secondary charged particles deflected through said first aperture for producing an electron signal corresponding to said pattern of said target specimen surface, wherein said charged particle detecting further includes producing and displaying an image of said specimen surface derived from said electronic signal produced by said secondary charged particles, and the step of introducing a gas containing metallic atoms into said gas container, wherein said gas with said metallic atoms passes through said second aperture to be adsorbed onto said target specimen surface, and the step of directing said focussed ion beam onto said adsorbed gas and metallic atoms adsorbed into said target specimen surface to cause said metallic atoms and said gas to decompose and to cause said metallic atoms to deposit onto said target specimen surface.

11. A method according to claim 10 further including the step of introducing a gas containing a reactive species into said gas container, wherein said gas with said reactive species passes through said second aperture to be adsorbed onto said target specimen surface, and the step of directing said focussed ion beam onto said adsorbed gas and reactive species adsorbed into said target specimen surface to cause said specimen surface to be modified.

* * * * *